United States Patent
Nguyen et al.

(10) Patent No.: US 10,096,455 B2
(45) Date of Patent: Oct. 9, 2018

(54) EXTENDED DARK SPACE SHIELD

(71) Applicant: APPLIED MATERIALS, INC., Santa Clara, CA (US)

(72) Inventors: Thanh Nguyen, San Jose, CA (US); Rongjun Wang, Dublin, CA (US); Muhammad M. Rasheed, San Jose, CA (US); Xianmin Tang, San Jose, CA (US)

(73) Assignee: APPLIED MATERIALS, INC., Santa Clara, CA (US)

(*) Notice: Subject to any disclaimer, the term of this patent is extended or adjusted under 35 U.S.C. 154(b) by 0 days.

(21) Appl. No.: 14/486,223

(22) Filed: Sep. 15, 2014

(65) Prior Publication Data

US 2015/0075980 A1    Mar. 19, 2015

Related U.S. Application Data

(60) Provisional application No. 61/879,119, filed on Sep. 17, 2013.

(51) Int. Cl.
*H01J 37/34* (2006.01)
*C23C 14/34* (2006.01)
*C23C 14/56* (2006.01)

(52) U.S. Cl.
CPC .......... *H01J 37/3441* (2013.01); *C23C 14/34* (2013.01); *C23C 14/564* (2013.01)

(58) Field of Classification Search
CPC ............. H01J 37/3441; C23C 14/3414; C23C 14/564; C23C 14/34
See application file for complete search history.

(56) References Cited

U.S. PATENT DOCUMENTS

| | | | | |
|---|---|---|---|---|
| 5,658,442 A * | 8/1997 | Van Gogh | ........... | C23C 14/3407 204/192.12 |
| 5,744,016 A * | 4/1998 | Yamada | .............. | C23C 14/0068 204/192.12 |
| 6,398,929 B1 * | 6/2002 | Chiang | ................. | C23C 14/046 204/298.11 |
| 7,026,009 B2 * | 4/2006 | Lin | ........................... | C23C 4/12 117/85 |

(Continued)

FOREIGN PATENT DOCUMENTS

JP    10018030 A  *  1/1998

OTHER PUBLICATIONS

Machine Translation JPH1018030, for JP 10018030 A.*
International Search Report and Written Opinion dated Dec. 15, 2014 for PCT Application PCT/US2014/055624.

*Primary Examiner* — Michael A Band
(74) *Attorney, Agent, or Firm* — Moser Taboada; Alan Taboada

(57) ABSTRACT

Apparatus for physical vapor deposition are provided. In some embodiments, an apparatus for use in a physical vapor deposition substrate processing chamber includes a process shield having a central opening passing through a body of the process shield and defining a processing volume of the substrate processing chamber, wherein the process shield comprises an annular dark space shield fabricated from a ceramic material and an annular ground shield fabricated from a conductive material, and wherein a ratio of a length of the annular dark space shield to a length of the annular ground shield is about 1:2 to about 1:1.6.

9 Claims, 2 Drawing Sheets

(56) References Cited

U.S. PATENT DOCUMENTS

| | | |
|---|---|---|
| 2006/0254904 A1 | 11/2006 | Golubovsky |
| 2009/0272647 A1 | 11/2009 | Young et al. |
| 2010/0252417 A1 | 10/2010 | Allen et al. |
| 2011/0278165 A1 | 11/2011 | Rasheed et al. |
| 2013/0153412 A1 | 6/2013 | Ritchie et al. |

* cited by examiner

EXTENDED DARK SPACE SHIELD

CROSS-REFERENCE TO RELATED APPLICATIONS

This application claims benefit of U.S. provisional patent application Ser. No. 61/879,119, filed Sep. 17, 2013, which is herein incorporated by reference.

FIELD

Embodiments of the present disclosure generally relate to physical vapor deposition processing equipment.

BACKGROUND

Existing physical vapor deposition (PVD) chambers typically utilize a two-piece shield configuration. The two-piece shield configuration comprises an upper shield, referred to as the dark space shield, and a lower shield, referred to as a ground shield. In the PVD chamber, particles sputtered from the target material, for example a dielectric material such as silicon, adhere to the dark space shield and the ground shield. However, the inventors have observed that silicon particles do not adhere well to the ground shield, and can peel off and contaminate the process chamber.

Accordingly, the inventors have provided improved apparatus for PVD processing.

SUMMARY

Apparatus for physical vapor deposition are provided. In some embodiments, an apparatus for use in a physical vapor deposition substrate processing chamber includes a process shield having a central opening passing through a body of the process shield and defining a processing volume of the substrate processing chamber, wherein the process shield comprises an annular dark space shield fabricated from a ceramic material and an annular ground shield fabricated from a conductive material, and wherein a ratio of a length of the annular dark space shield to a length of the annular ground shield is about 1:2 to about 1:1.6.

In some embodiments, a substrate processing chamber includes a chamber body having a substrate support disposed therein; a lid disposed atop the chamber body; a target assembly coupled to the lid opposite the substrate support, the target assembly including a target of material to be deposited on a substrate; and a process shield having a central opening passing through a body of the process shield and defining a processing volume of the substrate processing chamber, wherein the process shield comprises an annular dark space shield fabricated from a ceramic material and an annular ground shield fabricated from a conductive material, and wherein a ratio of a length of the annular dark space shield to a length of the annular ground shield is about 1:2 to about 1:1.6.

In some embodiments, a process kit shield for use in a physical vapor deposition substrate processing chamber includes an annular dark space shield fabricated from a ceramic material, wherein the annular dark space shield comprises an outer surface and an inner surface; and an annular ground shield fabricated from a conductive material, wherein the annular ground shield comprises an inner surface having a first portion disposed about an outer surface of the annular dark space shield and a second portion disposed below the annular dark space shield and exposed to a processing volume of the processing chamber, wherein the inner diameter of the second portion is substantially equal to an inner diameter of the annular dark space shield, and wherein the ratio of the length of the annular dark space shield to the length of the second portion of the annular ground shield is about 1:2 to about 1:1.6.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. It is to be noted, however, that the appended drawings illustrate only typical embodiments of this disclosure and are therefore not to be considered limiting of its scope, for the disclosure may admit to other equally effective embodiments.

Figure 1:
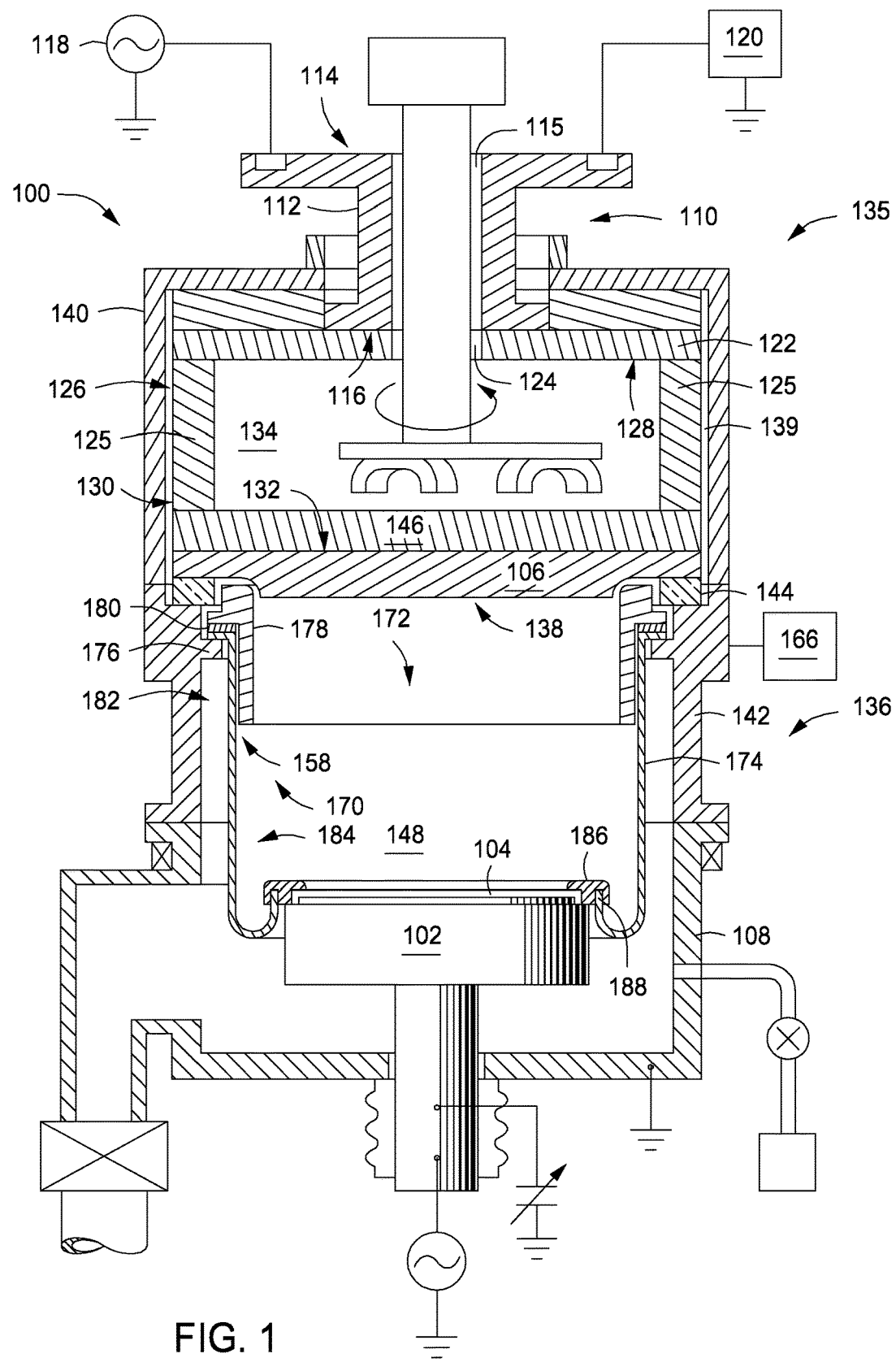
FIG. 1 depicts a schematic cross sectional view of a process chamber in accordance with some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Apparatus for improved physical vapor deposition processing equipment are provided herein. In some embodiments as described herein, the inventive apparatus, advantageously reduces contamination within a physical vapor deposition processing chamber and provides uniform deposition atop a substrate from center to edge.

FIG. 1 depicts a schematic, cross-sectional view of a physical vapor deposition chamber, or processing chamber 100 in accordance with some embodiments of the present disclosure. Examples of suitable PVD chambers include the ENDURA® PVD processing chamber, commercially available from Applied Materials, Inc., of Santa Clara, Calif. Other processing chambers from Applied Materials, Inc. or other manufactures may also benefit from the inventive apparatus disclosed herein.

In some embodiments, the processing chamber 100 has a chamber lid 135 disposed atop a chamber body 136. In some embodiments, the chamber lid includes a target assembly 138. In some embodiments, the target assembly 138 comprises a target 106 and a target backing plate 146. The target 106 comprises a material to be deposited on the substrate 104 during sputtering, such as a metal or metal oxide. In some embodiments, the target material is a dielectric material, such as silicon or silicon oxide or aluminum oxide. In some embodiments, the target backing plate 146 may comprise a conductive material, such as copper-zinc, copper-chrome, or the same material as the target, such that RF and DC power can be coupled to the target 106 via the target backing plate 146. Alternatively, the target backing plate 146 may be non-conductive and may include conductive elements (not shown) such as electrical feedthroughs or the like. In some embodiments, the target 106 may be supported on a grounded conductive aluminum adapter (i.e. upper chamber adapter 142) through a dielectric isolator 144.

The processing chamber 100 further includes a process shield 170. The process shield 170 comprises an annular dark space shield 178 and an annular grounded bottom shield (i.e. annular ground shield 174). In some embodiments, the annular ground shield 174 is connected to a ledge 176 of the upper chamber adapter 142. In some embodiments, the annular dark space shield 178 is supported on a spacer ring 180 atop the annular ground shield 174.

Figure 2:
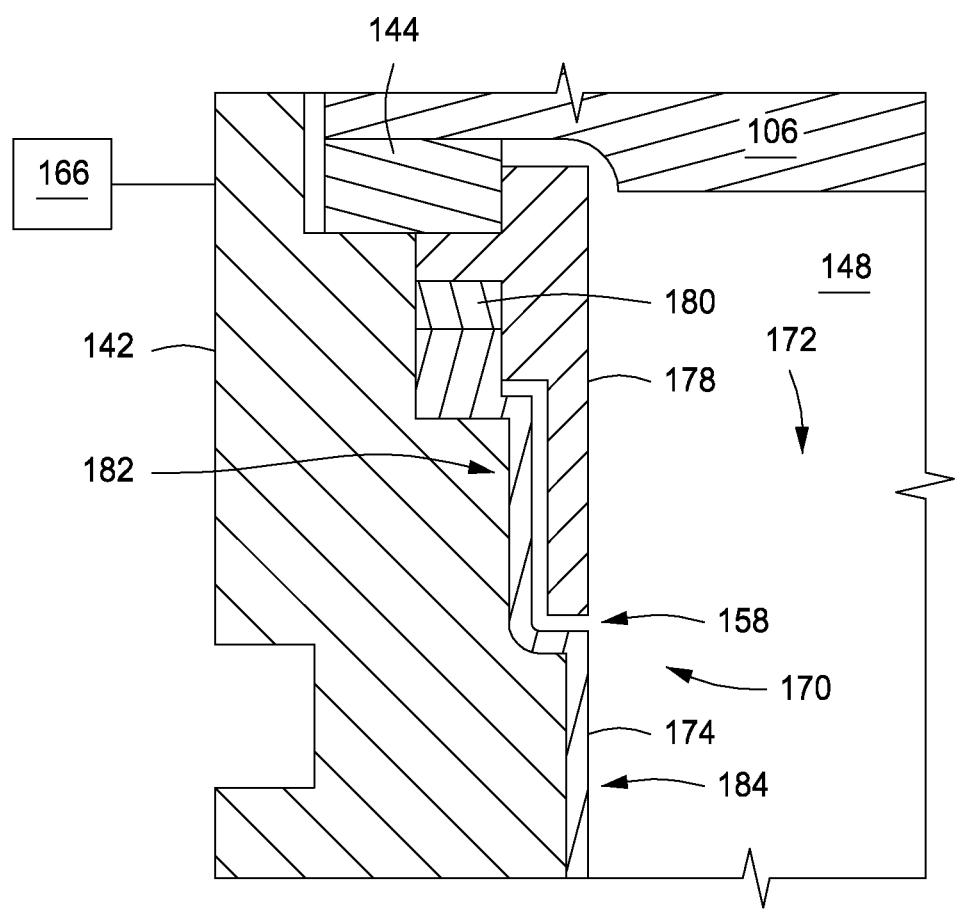
FIG. 2 depicts a sectional view of a process shield and surrounding structure in accordance with some embodiments of the present disclosure.

FIG. 2 depicts a sectional view of a process shield and surrounding structure in accordance with some embodiments of the present disclosure. The process shield 170 has a central opening 172 disposed through a body of the process shield 170. The central opening 172 defines a processing volume 148 in the processing chamber 100.

The annular dark space shield 178 is fabricated from a dielectric material, such as ceramic. By providing a annular dark space shield 178 fabricated from a dielectric material, arcing between the annular dark space shield 178 and adjacent components that are RF hot may be avoided or minimized. The annular dark space shield 178 is generally disposed about an outer edge of the target 106.

The annular ground shield 174 is fabricated from a conductive material such as aluminum alloy, stainless steel or the like. The annular ground shield 174 serves to protect other chamber components from damage and/or contamination from the process.

In some embodiments the height of the annular dark space shield 178 is about 2 inches to about 5 inches. In some embodiments, the height of the annular ground shield 174 is about 4 inches to about 8 inches. The ratio of the length of the annular dark space shield 178 to the length of the annular ground shield 174 is about 1:2 to about 1:1.6. Typically, physical vapor deposition chambers utilize a dark space shield having a height of about 1.48 inches. The inventors have observed that increasing the height of the annular dark space shield 178 pushes the plasma formed within the processing chamber 100 outward toward the edge of the substrate by increasing the distance needed for electrons to reach the annular ground shield 174. Pushing the plasma outward causes an increase in sputtering at the edge of the target 3106 which advantageously results in increased deposition uniformity upon the substrate from the center to the edge of the substrate. Furthermore, increasing the height of the annular dark space shield 178 also moves the junction between the annular dark space shield 178 and the annular ground shield 174 further away from the plasma formed in the processing chamber 100, advantageously reducing temperature fluctuations at the junction, which results in reduced particle contamination within the processing chamber 100.

In some embodiments, a heater 166 is coupled to the processing chamber 100 and configured to convectively heat the annular ground shield 174. In some embodiments, the annular ground shield 174 is heated to a temperature of about 40 to about 70 degrees Celsius. The inventors have observed that heating the annular ground shield 174 reduces the temperature gradient of the annular ground shield 174, resulting in less particles flaking off the annular ground shield 174.

In some embodiments, the annular ground shield 174 comprises a first portion 182 disposed about an outer surface of the annular dark space shield 178. The annular ground shield 174 further comprises a second portion 184 disposed below the annular dark space shield 178 and having an inner diameter that is substantially equal to an inner diameter of the annular dark space shield 178. In some embodiments, a gap 158 exists between a bottom of the annular dark space shield 178 and a top of the second portion of the annular ground shield 174.

Returning to FIG. 1, the processing chamber 100 contains a substrate support pedestal 102 for receiving a substrate 104 thereon. The substrate support pedestal 102 may be located within a grounded enclosure wall 108, which may be a chamber wall (as shown) or a grounded shield. The substrate support pedestal 102 has a material-receiving surface facing the principal surface of the target 106 and supports the substrate 104 to be sputter coated in planar position opposite to the principal surface of the target 106. The substrate support pedestal 102 may support the substrate 104 in a processing volume 148 of the processing chamber 100.

The annular ground shield 174 extends downwardly and may include a generally tubular portion having a generally constant diameter. The annular ground shield 174 extends along the walls of the upper chamber adapter 142 and the grounded enclosure wall 108 downwardly to below a top surface of the substrate support pedestal 102 and returns upwardly until reaching a top surface of the substrate support pedestal 102. A cover ring 186 rests on the top of the upwardly extending inner portion 188 of the annular ground shield 174 when the substrate support pedestal 102 is in its lower, loading position but rests on the outer periphery of the substrate support pedestal 102 when it is in its upper, deposition position to protect the substrate support pedestal 102 from sputter deposition. An additional deposition ring (not shown) may be used to shield the periphery of the substrate 104 from deposition.

A ground shield 140 is shown covering at least some portions of the processing chamber 100 above the target 106 in FIG. 1. In some embodiments, the ground shield 140 could be extended below the target to enclose the pedestal 102 as well.

The processing chamber includes a feed structure 110 for coupling RF and DC energy to the target 106. The feed structure is an apparatus for coupling RF energy, and optionally DC energy, to the target, or to an assembly containing the target, for example, as described herein. The feed structure 110 includes a body 112 having a first end 114 and a second end 116 opposite the first end 114. In some embodiments, the body 112 further includes a central opening 115 disposed through the body 112 from the first end 114 to the second end 116.

The first end 114 of the feed structure 110 can be coupled to an RF power source 118 and, optionally, a DC power source 120, which can be respectively utilized to provide RF and DC energy to the target 106. For example, the DC power source 120 may be utilized to apply a negative voltage, or bias, to the target 106. In some embodiments, RF energy supplied by the RF power source 118 may range in frequency from about 2 MHz to about 60 MHz, or, for example, non-limiting frequencies such as 2 MHz, 13.56 MHz, 27.12 MHz, or 60 MHz can be used. In some embodiments, a plurality of RF power sources may be provided (i.e., two or more) to provide RF energy in a plurality of the above frequencies. The feed structure 110 may be fabricated from suitable conductive materials to conduct the RF and DC energy from the RF power source 118 and the DC power source 120.

The second end 116 of the body 112 is coupled to a source distribution plate 122. The source distribution plate includes a hole 124 disposed through the source distribution plate 122 and aligned with the central opening 115 of the body 112. The source distribution plate 122 may be fabricated from suitable conductive materials to conduct the RF and DC energy from the feed structure 110.

The source distribution plate 122 may be coupled to the target 106 via a conductive member 125. The conductive member 125 may be a tubular member having a first end 126 coupled to a target-facing surface 128 of the source distribution plate 122 proximate the peripheral edge of the source distribution plate 122. The conductive member 125 further includes a second end 130 coupled to a source distribution plate-facing surface 132 of the target 106 (or to the target backing plate 146 of the target 106) proximate the peripheral edge of the target 106.

A cavity 134 may be defined by the inner-facing walls of the conductive member 125, the target-facing surface 128 of the source distribution plate 122 and the source distribution plate-facing surface 132 of the target 106. The cavity 134 is fluidly coupled to the central opening 115 of the body 112 via the hole 124 of the source distribution plate 122. The cavity 134 and the central opening 115 of the body 112 may be utilized to at least partially house one or more portions of a rotatable magnetron assembly 136 as illustrated in FIG. 1 and described further below. In some embodiments, the cavity may be at least partially filled with a cooling fluid, such as water ($H_2O$) or the like.

A ground shield 140 may be provided to cover the outside surfaces of the lid of the processing chamber 100. The ground shield 140 may be coupled to ground, for example, via the ground connection of the chamber body. The ground shield 140 has a central opening to allow the feed structure 110 to pass through the ground shield 140 to be coupled to the source distribution plate 122. The ground shield 140 may comprise any suitable conductive material, such as aluminum, copper, or the like. An insulative gap 139 is provided between the ground shield 140 and the outer surfaces of the source distribution plate 122, the conductive member 125, and the target 106 (and/or target backing plate 146) to prevent the RF and DC energy from being routed directly to ground. The insulative gap may be filled with air or some other suitable dielectric material, such as a ceramic, a plastic, or the like.

Thus, apparatus for use in a physical vapor deposition substrate processing chamber are provided herein. The inventive apparatus advantageously allows for advantageously reduces contamination within a physical vapor deposition processing chamber and provides uniform deposition atop a substrate from center to edge.

While the foregoing is directed to embodiments of the present disclosure, other and further embodiments of the disclosure may be devised without departing from the basic scope thereof.

The invention claimed is:

1. An apparatus for use in a physical vapor deposition substrate processing chamber, comprising:
a process shield having a central opening passing through a body of the process shield and defining a processing volume of the substrate processing chamber, wherein the process shield comprises an annular dark space shield fabricated from a ceramic material and an annular ground shield fabricated from a conductive material, and wherein a length of the annular ground shield is about 4 inches to about 8 inches and wherein a length of the annular dark space shield is about 2 inches to about 5 inches, and wherein the length of the annular ground shield is longer than the length of the annular dark space shield, wherein the annular ground shield comprises a first portion disposed about an outer surface of the annular dark space shield, and wherein the annular dark space shield is supported on a spacer ring atop the annular ground shield;
wherein the annular ground shield comprises a second portion with a top of the second portion disposed adjacent to and under a lowermost edge of the annular dark space shield, and wherein the spacer ring forms a gap between the lowermost edge of the annular dark space shield and the top of the second portion of the annular ground shield, the gap extending upwardly and outwardly, such that the gap terminates at a physical contact juncture between a vertical portion of the outer surface of the annular dark space shield and a vertical portion of an inner surface of the annular ground shield, the gap separating at least a portion of the first portion of the annular ground shield from the outer surface of the annular dark space shield.

2. The apparatus of claim 1, further comprising a heater coupled to the substrate processing chamber configured to convectively heat the annular ground shield to a temperature of about 40 to about 70 degrees Celsius.

3. A substrate processing chamber, comprising:
a chamber body having a substrate support disposed therein;
a lid disposed atop the chamber body;
a target assembly coupled to the lid opposite the substrate support, the target assembly including a target of material to be deposited on a substrate; and
a process shield having a central opening passing through a body of the process shield and defining a processing volume of the substrate processing chamber, wherein the process shield comprises an annular dark space shield fabricated from a ceramic material and an annular ground shield fabricated from a conductive material, and wherein a length of the annular ground shield is about 4 inches to about 8 inches and wherein a length of the annular dark space shield is about 2 inches to about 5 inches, and wherein the length of the annular ground shield is longer than the length of the annular dark space shield, wherein the annular ground shield comprises a first portion disposed about an outer surface of the annular dark space shield, and wherein the annular dark space shield is supported on a spacer ring atop the annular ground shield;
wherein the annular ground shield comprises a second portion with a top of the second portion disposed adjacent to and under a lowermost edge of the annular dark space shield, wherein an inner surface of the second portion is approximately aligned with an inner surface of the annular dark space shield, and wherein the spacer ring forms a gap between the lowermost edge of the annular dark space shield and the top of the second portion of the annular ground shield, the gap extending upwardly and outwardly, such that the gap terminates at a physical contact juncture between a vertical surface of the outer surface of the annular dark space shield and a vertical surface of an inner surface of the first portion of the annular ground shield, the gap separating at least a portion of the first portion of the annular ground shield from the outer surface of the annular dark space shield.

4. The substrate processing chamber of claim 3, further comprising a heater coupled to the chamber body configured to convectively heat the annular ground shield to a temperature of about 40 to about 70 degrees Celsius.

5. The substrate processing chamber of claim 3, wherein the target is a dielectric material.

6. The substrate processing chamber of claim 5, wherein the target is one of silicon or aluminum oxide.

7. The substrate processing chamber of claim 3, further comprising:
a power source coupled to the target.

8. The apparatus of claim 1, wherein a ratio of a length of the annular dark space shield to a length of the annular ground shield is about 1:2 to about 1:1.6.

9. An apparatus for use in a physical vapor deposition substrate processing chamber, comprising:
a process shield having a central opening passing through a body of the process shield and defining a processing volume of the substrate processing chamber, wherein the process shield comprises an annular dark space shield fabricated from a ceramic material and an annular ground shield fabricated from a conductive material, and wherein the length of the annular ground shield is about 4 inches to about 8 inches and the length of the annular dark space shield is about 2 inches to about 5 inches, wherein the annular dark space shield comprises an outer surface and an inner surface, and wherein the annular ground shield comprises an inner surface having a first portion disposed about an outer surface of the annular dark space shield and a second portion disposed below the annular dark space shield and exposed to a substrate processing volume of the processing chamber, wherein an inner surface of a top of the second portion is aligned with an inner surface of a bottom of the annular dark space shield, and wherein the annular dark space shield is supported on a spacer ring atop the annular ground shield;

wherein the spacer ring forms a gap between a bottom edge of the annular dark space shield and a top of the second portion of the annular ground shield, the gap extending upwardly and outwardly, such that the gap terminates at a physical contact juncture between a vertical portion of the outer surface of the annular dark space shield and a vertical portion of the inner surface of the first portion of the annular ground shield, the gap separating at least a portion of the first portion of the annular ground shield from the outer surface of the annular dark space shield.

* * * * *